(12) United States Patent
Qureshi

(10) Patent No.: US 11,546,063 B1
(45) Date of Patent: Jan. 3, 2023

(54) LASER LIGHT SOURCE AND OPTICAL NETWORK SYSTEM

(71) Applicant: KING FAHD UNIVERSITY OF PETROLEUM AND MINERALS, Dhahran (SA)

(72) Inventor: Khurram Karim Qureshi, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 17/833,274

(22) Filed: Jun. 6, 2022

Related U.S. Application Data

(60) Provisional application No. 63/313,017, filed on Feb. 23, 2022.

(51) Int. Cl.
| | | |
|---|---|---|
| *H04B 10/50* | (2013.01) | |
| *H01S 3/067* | (2006.01) | |
| *H04J 14/02* | (2006.01) | |

(52) U.S. Cl.
CPC ......... *H04B 10/505* (2013.01); *H01S 3/0675* (2013.01); *H01S 3/06791* (2013.01); *H04J 14/0221* (2013.01); *H04J 14/0298* (2013.01)

(58) Field of Classification Search
CPC . H04B 10/505; H01S 3/0675; H01S 3/06791; H04J 14/0221; H04J 14/0298
(Continued)

(56) References Cited

U.S. PATENT DOCUMENTS

| | | | | |
|---|---|---|---|---|
| 5,946,129 A | * | 8/1999 | Xu | ............ H01S 3/109 359/332 |
| 7,394,953 B1 | * | 7/2008 | Nagarajan | .......... G02B 6/12019 385/37 |

(Continued)

FOREIGN PATENT DOCUMENTS

| | | |
|---|---|---|
| CN | 106197305 A | 12/2016 |
| CN | 107332102 B | 3/2019 |

(Continued)

OTHER PUBLICATIONS

Dernaika, et al. ; Tunable L-band semiconductor laser based on Mach-Zehnder interferometer ; Optics Communications 402 ; pp. 56-59 ; Jul. 4, 2017 ; 4 Pages.

(Continued)

*Primary Examiner* — Dalzid E Singh
(74) *Attorney, Agent, or Firm* — Oblon, McClelland, Maier & Neustadt, L.L.P.

(57) ABSTRACT

A laser light source includes an inner ring and an outer ring. The inner ring includes a semiconductor optical amplifier (SOA), a pair of optical circulators, a first optical filter, and a first optical waveguide connecting those in series. The outer ring includes the SOA, a pair of optical circulators, a second optical filter, an output port, and a second optical waveguide connecting those in series except for a portion shared. The inner ring operates as a gain-clamped SOA with a feedback control light defined by the first optical filter. The outer ring generates a laser output in a gain region of the clamped SOA, and with multiple peak wavelengths defined by the second optical filter, in a range from L Band to U band, applicable to WDM network systems. A WDM network system and a method of controlling the laser light source are also disclosed.

18 Claims, 12 Drawing Sheets

(58) Field of Classification Search
USPC .......................................................... 398/183
See application file for complete search history.

(56) References Cited

U.S. PATENT DOCUMENTS

| | | | | |
|---|---|---|---|---|
| 9,019,998 | B1* | 4/2015 | Qureshi | .................. H01S 5/142 |
| | | | | 372/6 |
| 2001/0053008 | A1* | 12/2001 | Ueno | .................. H04B 10/508 |
| | | | | 398/155 |
| 2004/0001248 | A1* | 1/2004 | Grubb | ................ H04B 10/2939 |
| | | | | 359/333 |
| 2006/0222039 | A1* | 10/2006 | Yamazaki | ............. H01S 5/1032 |
| | | | | 372/94 |

FOREIGN PATENT DOCUMENTS

| | | |
|---|---|---|
| JP | 2005-24891 A | 1/2005 |
| KR | 10-2008-0035206 | 4/2008 |
| WO | 2021/184993 A1 | 9/2021 |

OTHER PUBLICATIONS

Wang, et al. ; C- and L-band tunable fiber ring laser using a two-taper Mach-Zehnder interferometer filter ; Optics Letters vol. 35, No. 20 ; Oct. 15, 2010 ; 4 Pages.

* cited by examiner

LASER LIGHT SOURCE AND OPTICAL NETWORK SYSTEM

CROSS-REFERENCE TO RELATED APPLICATIONS

The present application claims benefit of priority from U.S. Provisional Patent Application No. 63/313,017 having a filing date of Feb. 23, 2022_and which is incorporated by reference in its entirety.

BACKGROUND

Technical Field

The present disclosure is directed to a laser light source for an optical network system and the optical network system. In particular, the present disclosure relates to a wavelength division multiplex network system.

Description of Related Art

The "background" description provided herein is to generally present the context of the disclosure. Work of the presently named inventors, to the extent it is described in this background section, as well as aspects of the description that may not otherwise qualify as prior art at the time of filing, are neither expressly nor impliedly admitted as prior art against the present invention.

Fiber optics (also referred to as optical fiber technology) is playing a significant role in information technology. Fiber optic cables carry information encoded into an optical signal from one node to another node using optical fiber technology at high speed. Optical fiber technology may be implemented as either a single-mode fiber (SMF) designed to carry only a single transverse mode of light, or a multi-mode fiber (MMF) designed to carry multiple transverse modes of light.

The SMF can support a greater transmission rate and higher bandwidth than those of the MMF and can be utilized for long-distance transmissions. The SMF exhibits enormous low-loss for bandwidth of several tens of Terahertz. Despite the desirable potential characteristics, utilization of SMF transmission is limited due to dispersive effects observed during the optical transmission. For further efficient utilization of SMF transmission, a Wavelength Division Multiplexing (WDM) technology has been proposed and proved effective, as described in, for example, "A review of WDM Technology and Applications," G. E. Keiser, Optical Fiber Technology, Vol. 5, Issue 1, pp. 3-39, January 1999, and "Wavelength-division multiplexing," at https:_//en.wikipedia.org/wiki/Wavelength-division_multiplexing.

In the SMFs employing WDM technology, each of the SMFs can simultaneously transport a plural number of carrier waves with different wavelengths within a low-loss window determined by physical characteristics of the SMF. A state-of-the art WDM technology to combine these wavelengths or add one of them on the fiber and drop another of them off the fiber, as described in, for example, "OADM (Optical Add-Drop Multiplexer) Tutorial," at https:_//community.fs.com/blog/oadm-optical-add-drop-multiplexer-tutorial.html, and "Multiwavelength Optical Networks," T. E. Stern and K. Bala, Prentice Hall, Upper Saddle River, N.J., 2000, entire content of both is incorporated herein by reference.

With the current state-of-art technology, a limited number of wavelengths are supported within the low-loss windows. For example, 40 channels with 100 GHz frequency spacings (about 0.8 nm wavelength spacings) or 80 channels with 50 GHz frequency spacings (about 0.4 nm wavelength spacings) have been defined for wavelength range 1528.77 to 1563.86 nm (C-Band) by telecommunication standardization sector of international telecommunication union (ITU-T) as described in "Spectral grids for WDM applications: DWDM frequency grid," ITU-T G.694.1 (10.2020), at https:_//www.itu.int/rec/T-REC-G.694.1-202010-I/en.

Thus, the spectral grids standard given by ITU-T G.694.1 for WDM applications prevailing at a time of reduction to practice is defined here as ITU-T WDM grids.

Thus, transmission techniques that increase the number of wavelengths is in urgent need due to rapid growth of data communications in recent years. As a result, continuous efforts have been made to make WDM network systems more robust and effective.

Such research area includes a laser light source for the WDM network systems. Multiwavelength fiber lasers, which are capable of generating laser output at multiple wavelengths, have attracted attention as promising candidates due to their potential applications not only in WDM network systems, but also in optical instrument testing and characterization, optical sensing, spectroscopy, and microwave photonics. Multiwavelength laser light sources may also be an effective solution for next-generation passive optical networks (NG-PONs) to facilitate the ever-growing demand for telecommunication capacities and internet traffic. Therefore, there is a need to explore multiwavelength laser light sources operating not only in the already congested conventional (C-band) but also in the untapped L-band (1565-1625 nm) and U Band (1625-1675 nm).

An erbium-doped fiber (EDF) has been a conventional gain medium to realize the multiwavelength laser light sources. The EDF provides a high saturation output power, a large gain, and a relatively low noise figure (NF). However, the multiwavelength fiber lasers based on EDF technology suffer from mode competition among different lasing modes, and lead to unstable operation at room temperature as described, for example, in "Multiwavelength Fiber Laser Covering far L and U bands in a Dual Cavity Configuration," K. K. Qureshi, IEEE Photon. Tech. Lett. Vol. 33, No. 6, Mar. 15, 2021.

Alternative approaches using a semiconductor optical amplifier as the gain medium of the fiber laser have been reported for suppressing the instability due to the mode competitions, as described in the References listed with Table I in below descriptions, all of those references are incorporated herein by reference. However, those reported approaches are focused on either C or L Bands. Approaches forming passive optical components as monolithic integrated devices and integrating further with active optical devices such as laser diodes have been reported. Those passive components include not only an optical waveguide or an optical attenuator, but also a Mach-Zehnder Interferometer, and an optical circulator, as described in, for example, W. Idler et al., "10 Gb/s wavelength conversion with integrated multiquantum-well 3-port Mach-Zehnder Interferometer," IEEE Photon. Technol. Lett., vol. 8, pp. 1163-1165, September 1996, and P. Pintus, et al. "Integrated TE and TM optical circulators on ultra-low loss silicon nitride platform," Opt. Express 21(4) 5041-5052 (2013).

Therefore, one object of the present disclosure is to provide a multiwavelength laser source that can operate in the L band and U band and provide stable operation at room temperature.

SUMMARY

In an exemplary embodiment, a laser light source includes, an inner ring and an outer ring. The inner ring includes a semiconductor optical amplifier (SOA), a pair of optical circulators, a first optical filter, and a first optical waveguide optically connecting other elements in the inner ring in series, with the SOA aligned between the pair of optical circulators to form the inner ring. The outer ring includes the SOA, the pair of optical circulators, a second optical filter, an output port, and a second optical waveguide optically connecting elements of the outer ring in series to form the outer ring, except for a portion of the inner ring between the pair of circulators, the portion shared with the outer ring. The pair of optical circulators are configured to limit a direction of light propagation in the SOA to a first direction for a light circulating the inner ring, and to a second direction opposite to the first direction, for a light circulating the outer ring. The inner ring is configured to operate as a gain-clamped semiconductor optical amplifier with a feedback control light under an operating condition with a designed injection current and at a designed ambient temperature. A peak wavelength of the feedback control light is configured to be defined by a passband of the first optical filter. The outer ring is configured to generate from the output port a laser output within a wavelength region corresponding to a gain region of the gain-clamped SOA under the operating condition. The laser output includes a peak wavelength defined by a passband of the second optical filter, distributed in a range from L band to U Band, in certain embodiments. In certain embodiments, the laser light source further includes a variable attenuator either in the outer ring or in the inner ring inserted in series, and a wavelength selector at the output port, and a lasing wavelength region defined by a distribution of the peak wavelength of the laser output is configured wavelength tunable by varying an attenuation of the variable optical attenuator, and the wavelength selector is configured to select and output at least a peak wavelength of the laser output.

In another exemplary embodiment, an optical wavelength division multiplex (WDM) network system includes, a transmitter, a fiber transmission line, an optical cross connect, and a receiver. The transmitter further includes the laser light source(s) described above. Under certain embodiments, the laser light source provides a wavelength selective light sources applicable to the WDM network system.

In another exemplary embodiment, a method of controlling the laser light source as a wavelength selective light source in a wavelength region from L-band to U-band includes monitoring the laser output spectrum, adjusting the lasing wavelength region by varying attenuation of optical attenuator inserted in series either in the outer ring or the inner ring when necessary, and selecting a peak wavelength meeting the requirement for the application to the WDM network system.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
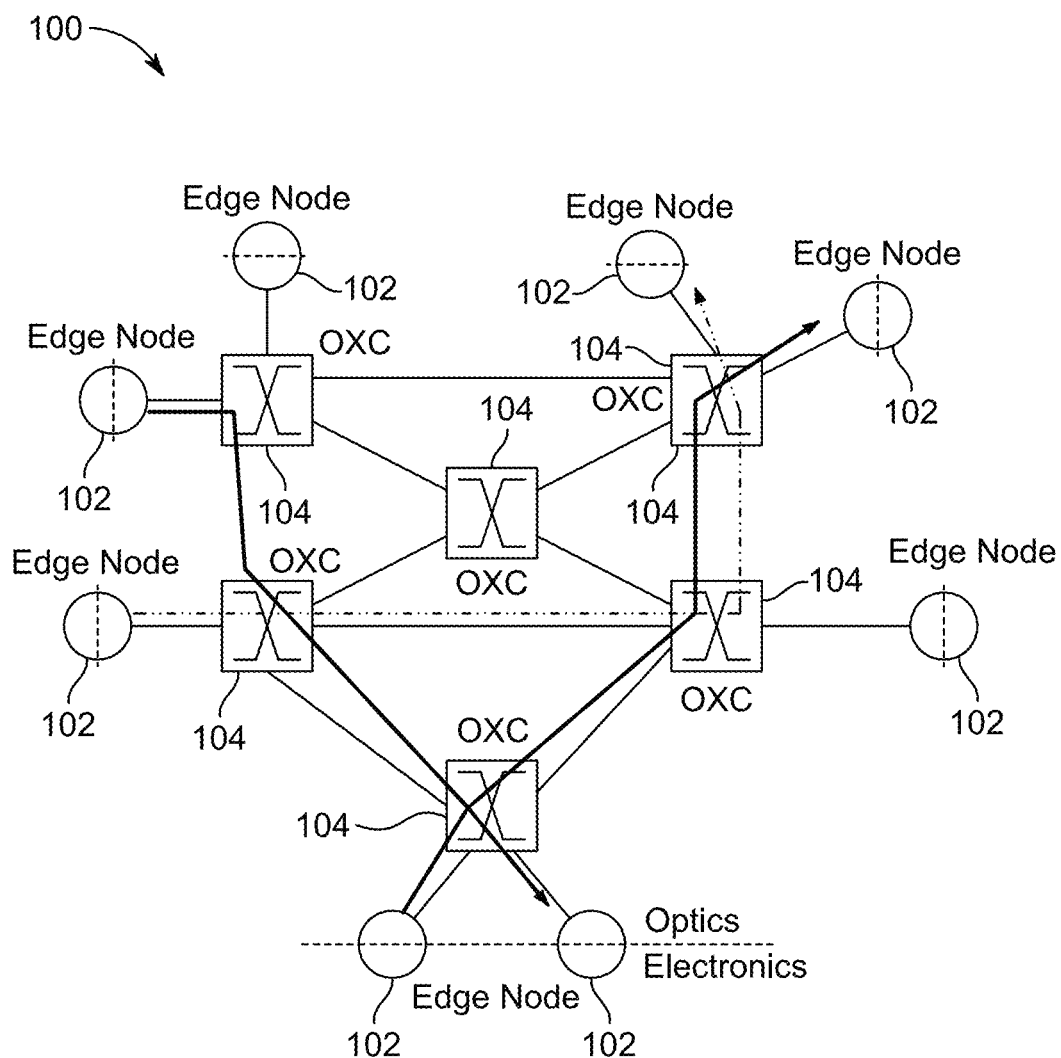
FIG. 1 is a schematic block diagram illustrating a general architecture for the WDM network, according to certain embodiments.

In the drawings, reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a laser light source configured to generate a laser output with at least a peak wavelength applicable as a light source for a WDM network systems, and also to the WDM network system including the laser light source disclosed herein.

A laser light source according to certain embodiments of the present disclosure is based on a semiconductor optical amplifier (SOA) as a gain media, and is configured to exhibit a stable output spectrum with negligible mode competition even as the multiple wavelength laser light sources. The laser light source is applicable as a light source for the WDM network system not only in conventional C-band, but also in long (L-band) and ultra-long (U-bands).

FIG. 1 is a schematic block diagram illustrating a general architecture for the WDM network system. The WDM network system 100 may form a basis for a wide-area all-optical infrastructure, and includes at least two types of nodes. A first type of node is an optical cross-connect (OXC) 104s which connects fibers, switches and reconfigures connections in the network. The second type of node is an edge node 102 which provides an interface between an optical part of the WDM network system and non-optical end systems, such as internet protocol (IP) routers, asynchronous transfer mode (ATM) switches, or supercomputers. The edge nodes 102 provide access nodes functioning as terminating points, for example, as a source point and/or a destination point, for the optical signal paths. The communication paths may continue an electrical form outside the optical part of the network.

The optical WDM network system 100 offers to end systems logical connections implemented using light paths, as illustrated in FIG. 1 by directed lines. The light paths, also referred to as k-channels, provide clear optical paths between two edge nodes 102. Namely, information transmitted on a light path does not undergo any conversion to and from the electrical form within the optical part of the network. In the WDM network systems, the light path behaves as a transparent or clear channel between an edge node 102 at the source point and an edge node at the destination point. The light path is established and reconfigured by the OXC, through switching of paths and selection of a wavelength which is fixed for a routing, referred to as wavelength routing, based on availabilities of paths and wavelengths, and according to directions from a system administrator.

In general, ensuring availability of a full transmission capacity, a transmitter is required to install a same number of laser light sources as a number of wavelengths adopted by the WDM network system adopts. A multiple wavelength laser light source, according to the present disclosure and configured to be wavelength selectable would be one of the most promising candidates for such applications.

Figure 2:
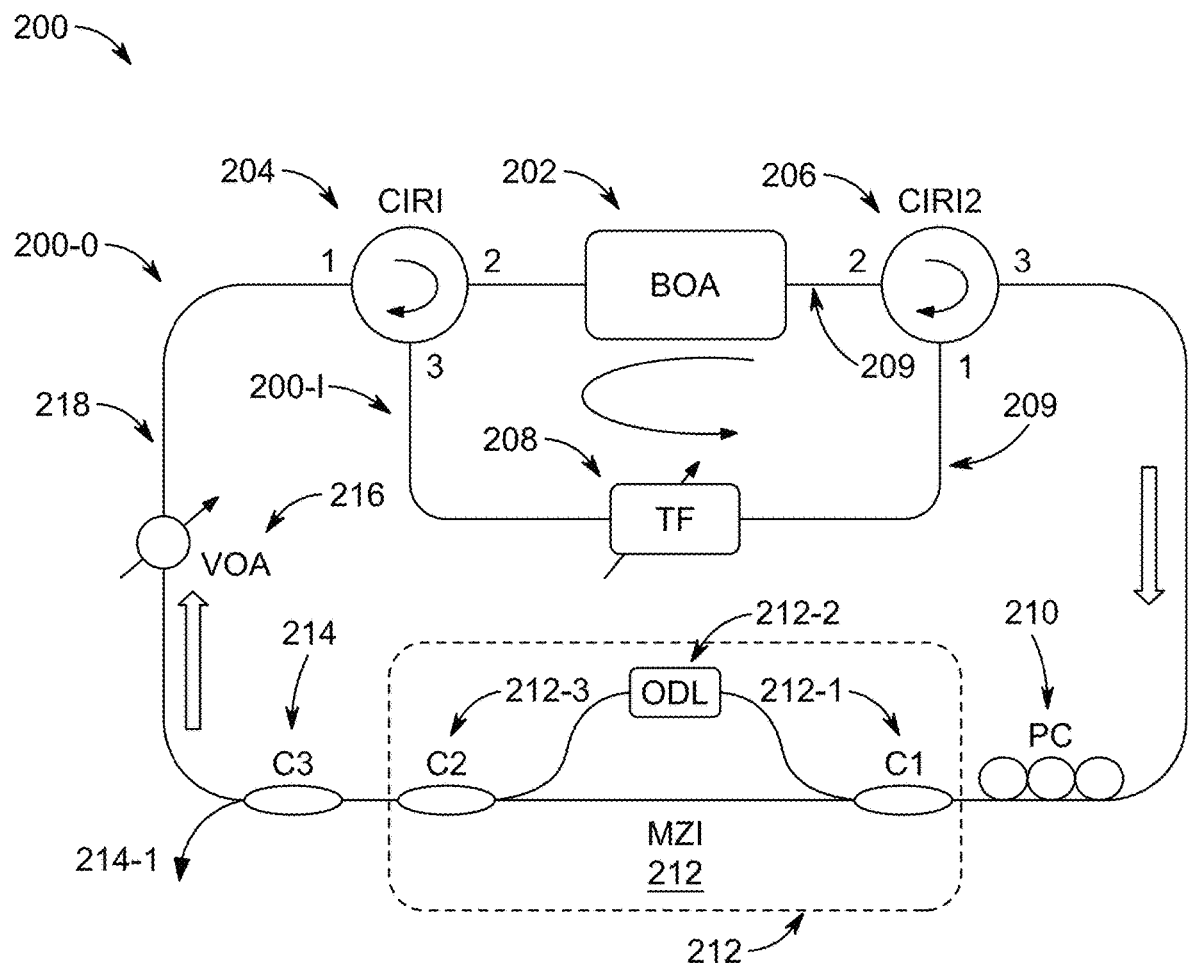
FIG. 2 is a schematic block diagram of the multiwavelength laser light source, according to certain embodiments.

FIG. 2 is a schematic block diagram of the multiwavelength laser light source, according to certain embodiments. In an exemplary embodiment, the multiwavelength laser light source 200 includes, but is not limited to, an inner ring 200-I and an outer ring 200-O. Respective components of the inner ring 200-I and the outer ring 200-O are placed in a configuration where the inner ring 200-I is placed within the outer ring 200-O and conjoined to the outer ring 200-O via a pair of optical circulators to share a gain component with the outer ring 200-O.

According to one embodiment, the inner ring 200-I includes a semiconductor optical amplifier (herein after, SOA 202), a pair of optical circulators, a first optical filter 208, and a first optical waveguide. The SOA 202 provides a semiconductor optical gain media under an operating condition. A semiconductor device for the SOA is prepared conventionally by foaming antireflective coatings on both facets of a semiconductor laser to eliminate the resonator structure. In one example, a booster optical amplifier (hereinafter, BOA 202) is used as the optical gain component. The BOA 202 is also a semiconductor based optical amplifier. In a narrower definition adopted in some market products currently available, the SOA provides a polarization-insensitive gain, while the BOA provides a polarization-sensitive gain. In the present disclosure, a wider definition of the SOA is adopted for simplicity: the SOA includes the BOA. The BOA can be categorized as a specific type of the SOA, based on a common operation principle. In one example, center wavelength of the SOA 202 ranges from approximately 1050 nm to 1625 nm. In a further example, the 3 dB bandwidth of amplified spontaneous emission (ASE) gain profile (herein after "ASE gain bandwidth") ranges from approximately 50 nm to 100 nm. In one implementation, a polarization controller 210, described in detail in further part of disclosure, is implemented for adjusting a polarization state.

In one exemplary embodiment, the SOA 202 is configured to exhibit a facet reflectivity not larger than 0.1%, and the 3-dB gain band of ASE gain profile (hereinafter, "ASE gain band") distributed in C-band to L-band, under the operating condition without a feedback control light.

In one implementation, a pair of optical circulators are implemented in series with the SOA 202, such that the SOA 202 is aligned between the pair of optical circulators, to limit the direction of light propagation within the SOA in a certain direction. The pair of optical circulators include a first optical circulator 204 and a second optical circulator 206. Each of the pair of optical circulators includes a first port, a second port, and a third port. Optical signals coupled into the first port is directed to the second port, and optical signals coupled into the second port is directed to the third port. The pair of optical circulators are configured to limit a direction of light propagation in the SOA 202 to a first direction for a light circulating the inner ring 200-I, and to a second direction opposite to the first direction, for a light circulating the outer ring 200-O. In one exemplary implementation, the pair of optical circulators are configured to be polarization insensitive and to provide isolation not smaller than 40 dB. Several alternative approaches realizing the optical circulators are reported, as described in "Introduction to Fiber-Optic Communications, Chapter 6—Passive optical components," R. Hui, 2020 Academic Press, entire contents of which is incorporated herein by reference.

In one implementation, a first optical filter 208 is implemented in the inner ring 200-I in series with the SOA 202 and the pair of the optical circulators 204-206. The first optical filter 208 is configured to transmit a specific wavelength range, referred as to a passband, and reject other wavelengths falling outside the passband. For example, the first optical filter 208 can be a thin film Fabry-Perot interferometer formed by vacuum deposition. In one implementation, the Fabry-Perot interferometer may be an all-dielectric type. In another implementation, the Fabry-Perot interferometer may be a metal-dielectric type. In one example, the first optical filter 208 is a Fabry-Perrot interferometer with a 3-dB bandwidth of a passband about 0.03 nm, and with a free spectral range of about 100 nm, where preferably the 3-dB bandwidth is not larger than about 0.03 nm, and the free spectral range is not smaller than about 100 nm.

The first optical filter 208 is configured to locate a peak wavelength of a feedback control light in the proximity of a shorter wavelength end of the ASE gain band of the SOA measured under the operating condition and without the feedback control light, in order to constitute the inner ring 200-I as a gain clamped SOA under the operating condition and with the feedback control light.

In one or more embodiments, the optical filter implemented as a first optical filter 208 is a tunable optical filter (TF). The tunable optical filter is the optical filter where certain filter parameters are tunable either manually or with an electronic control system. For example, in the case of the first optical filter 208, the center wavelength of the passband can be varied. In some cases, the bandwidth can also be varied. Thus, the first optical filter 208 can be tuned to transmit only certain passbands while blocking others.

In one embodiment, the first optical waveguide 209 is configured to optically connect the SOA 202, the pair of optical circulators 204 and 206, and the first optical filter 208 in series, thereby forming the inner ring 200-I. The optical waveguide 209 is a physical structure that guides light waves. Examples of the optical waveguide includes, but not limited to, the optical fiber, a solid waveguide made of transparent dielectric materials and formed on a substrate, liquid light guides, and liquid waveguides. In one implementation, the optical fiber is implemented to optically connect the components of the inner ring 200-I in series and complete the optical circuit.

As indicated in FIG. 2, the inner ring 200-I is configured to circulate the feedback control light in an anti-clockwise direction, in one implementation. In this anti-clockwise formation, a light emitted from one facet of the SOA and guided toward the first optical circulator 204 is directed from the second port to the third port only. From the third port, the light is guided towards the first optical filter 208, where only wavelength components in the passband of the first optical filter 208 can pass through. A passed light is further guided to the second optical circulator 206, where the passed light is directed from the first port to a second port of the second optical circulator 206, and finally guided into the SOA. The passed light further propagates through the SOA 202 for the amplification process. From the SOA 202, an amplified light output is further guided into the second port of the first optical circulator 204, completing, thereby, the inner ring 200-I circle in the anti-clockwise direction. A light emitted from the other facet of the SOA and guided toward the second optical circulator 206 is directed from the second port to the third port of the second optical circulator connected with the outer ring 200-O, thus isolated from the inner ring 200-I.

In the exemplary embodiment, the inner ring 200-I is configured to operate as a gain-clamped semiconductor optical amplifier with a feedback control light under an operating condition with a designed injection current and at a designed ambient temperature. A peak wavelength of the feedback control light is configured to be defined by the passband of the first optical filter 208.

As further illustrated in FIG. 2, the outer ring 200-O is configured to circulate the light in the clockwise direction, opposite to the direction of the inner ring 200-I, in accordance with one implementation. The outer ring 200-O includes, but not be limited to, the SOA 202, the pair of optical circulators, a polarization controller 210, a second optical filter 212, an output port 214-1, and a second optical waveguide 218.

According to one implementation of the embodiment, the SOA 202 and the pair of optical circulators 204 and 206 are shared by the inner ring 200-I and the outer ring 200-O, as illustrated in FIG. 2. According to the embodiment, the outer ring 200-O is configured to generate a laser output with a multiwavelength spectrum with a plurality of peak wavelengths distributed within a wavelength region longer than the peak wavelength of the feedback control light, and with peak wavelength values defined by center wavelengths of passbands of the second optical filter 212.

In one embodiment, the outer ring 200-O includes the polarization controller 210 connected in series to control the state of polarization of the light that circulates in the outer ring 200-O. Various fiber optic devices, such as BOA 202 or interferometers, require an adjustable state of polarization of light in a fiber. Therefore, based upon the fiber optic device and corresponding requirements, the polarization controller 210 is implemented under certain embodiments. For example, the polarization controller 210 includes two quarter-wave plates and a half-wave plate. In one example, the polarization controller 210 is a manual polarization controller 210. In another example, the fiber controller can be a motorized polarization controller 210. However, when a polarization maintaining fiber or a polarization maintaining waveguide was used as the first and the second optical waveguide, the polarization controller may be eliminated.

In one embodiment, the outer ring 200-O includes the second optical filter 212 configured to exhibit a passband within the wavelength region corresponding to the gain region of the gain-clamped SOA 202 under the operating condition and at a wavelength region longer than the peak wavelength of the feedback control light.

In one implementation, the second optical filter 212 is a Mach-Zehnder Interferometer (hereinafter referred to as MZI 212). The MZI 212 includes, but is not limited to, a first optical coupler 212-1 as an input port and as a splitter, an optical delay line (ODL 212-2), and a second optical coupler 212-3 as a combiner and as an output port. In one example, the first and the second optical couplers can be 3 dB couplers.

An input light beam into the MZI 212 is split into two light beams after passing through the first optical coupler (212-1, C1). The two light beams pass through two arms, one of the arms includes the ODL 212-2. At the output port of the second optical coupler (212-3, C2), two light beams recombine and interfere with each other. An intensity $I_{out}$ at the output port of the MZI 212 is given by:

$$I_{out}(\lambda) = I_1(\lambda) + I_2(\lambda) + 2\sqrt{I_1(\lambda)I_2(\lambda)} \cos\Delta\theta, \qquad (1)$$

where $I_1$ and $I_2$ are the intensities of the two light beams, and $\Delta\theta$ is a phase difference between the two light beams when they interfere. An output spectrum of the MZI 212 exhibits an equal wavelength spacing between its transmission peaks and is given by:

$$\Delta\lambda = \lambda^2/n\Delta L, \qquad (2)$$

where $\lambda$, $n$, and $\Delta L$ are, respectively, a central wavelength, an effective index, and a path difference between the two arms of the MZI. The equal wavelength spacing of the transmission peaks is termed as a free spectral range (FSR). The wavelengths of the transmission peaks can also be fine-tuned by adjusting the path difference.

Thus, the MZI 212 acts as a comb filter that exhibits a plurality of passbands with a designed wavelength spacing of the passbands, namely the FSR and designed center wavelengths. In one implementation, the second optical filter is a tunable Mach-Zehnder Interferometer (MZI) configured to exhibit a wavelength spacing of the passbands (FSR) of about 0.8 nm and a 3 dB bandwidth of each of the passbands not greater than 0.1 nm, and configured to exhibit an operation wavelength range covering the gain region of the gain clamped SOA 202 under the operating condition, for example, from 1520 to 1650 nm. Under certain embodiments, the MZI is preferably tuned to center wavelengths of the passbands and a peak wavelength spacing of the passbands that meet wavelength requirements of the ITU-T WDM grids.

In one implementation, the outer ring 200-O includes a third optical coupler 214 connected in series with MZI 212. In one example, the third optical coupler 214 is a 70:30 fused fiber coupler. The third optical coupler 214 provides a branch connected with the second optical waveguide 218 and further connected with a variable optical attenuator (VOA) 216, and an output port 214-1 configured to output the multiwavelength laser light source.

In one exemplary embodiment, a variable optical attenuator (herein after VOA) 216 is inserted in the outer ring 200-O in series. As detailed in FIG. 8, it is demonstrated that increasing the attenuation of the VOA 216 by 10 dB caused a blue shift of about 10 to 14 nm of a lasing wavelength region defined by a distribution of the peak wavelengths of the multiwavelength spectrum. Those results support a capability of the multiwavelength laser of the present disclosure as a wavelength tunable or wavelength selectable laser light source. As detailed in FIG. 6, this is attributed to a gain spectrum profile of the gain-clamped SOA, as observed in the modified ASE, where in a wavelength region longer than the gain peak, the gain profile exhibits a slope and thus shorter the wavelength, higher the gain. This means when a larger threshold gain is required due to the attenuation increased, the lasing wavelength shifts toward a shorter wavelength.

According to an exemplary embodiment, the VOA is implemented also in the inner ring 200-I in series (not illustrated in the Figure). In the gain-clamped SOA, essentially same as one constituted by the inner-ring 200-I, introducing a 10 dB loss by an attenuator inserted in series causes the clamped gain an increase of over 15 dB, as described in "Gain Control of Semiconductor Optical Amplifier Using a Optical Filter in a Feedback Loop," K. K. Qureshi et al., *IEEE Photon. Tech. Lett.* 1401-1403, Vol. 19, No. 18, Sep. 15, 2007, entire contents of which is incorporated herein by reference. The increase of the clamped gain reported is attributed to an increase in carrier density required for the lasing of the feedback control light. This increase would inevitably bring an additional change including an upper and a blue shift of the ASE in the clamped ASE of FIG. 6. This change in the ASE would provide an enhanced wavelength tunability with a broader tunable wavelength range.

Therefore, inserting an attenuator in the inner ring 200-I provides an additional element to enhance the wavelength tunable capability of the multiwavelength laser of the present disclosure.

As described above, according to one implementation, a lasing wavelength region, defined by a distribution of the plurality of major peak wavelengths, is configured to be wavelength tunable at least in a portion of the gain region of the gain-clamped SOA 202, by adjusting or varying attenuation of the VOA 216.

According to an exemplary embodiment, the VOA 216 may be implemented in both, the outer ring 200-O and the inner ring 200-I.

In one exemplary embodiment, the second optical waveguide 218 is configured to optically connect the optical circulator 206, the polarization controller 210, the second optical filter 212, the output port 214, the VOA 216 and the optical circulator 204 in series to form the outer ring 200-O including portions between the BOA 202 and the pair of optical circulators, already connected by the first optical waveguide 209.

The outer ring 200-O is configured to circulate the light wave in a clockwise direction, opposite to the direction of the inner ring 200-I. When the SOA 202 emitted a light wave and guided to the second port of the second optical circulator 206, the light wave is directed only to the third port of the second optical circulator 206. From the third port, the light wave is guided to the polarization controller 210 and further to the MZI 212. A filtered light wave is guided to the VOA 216. After possibly being attenuated, the light wave is guided to the second port of the first optical circulator 204. From the second port, the light wave is directed only towards the BOA 202, completing the outer ring 200-O circulation of the light wave, in accordance with certain embodiments.

In the exemplary embodiment, the outer ring 200-O is configured to generate a laser light and output the laser output from the output port 214-1. A wavelength region of the laser output corresponds to a gain region of the gain-clamped SOA under the operating condition, with a peak wavelength of the laser output defined by the second optical filter.

In one embodiment, the first optical waveguide and the second optical waveguide are single mode fiber (SMF). When a conventional SMF without a polarization maintaining characteristics is used, the laser output is stabilized preferably through adjustment of a polarization state by the polarization controller 210. When a polarization maintaining fiber (PMF) constitutes the first optical waveguide and the second optical waveguide, the adjustment of the polarization state can be performed without the polarization controller 210.

In one embodiment, either one or both of the first optical waveguide and the second optical waveguide is(are) solid state device(s) formed on a substrate. Approaches forming or integrating more complicate optical components such as the MZI or the optical circulator as monolithic integrated devices have been reported as described earlier. Based on such progress and technology trends, the laser light source 200 may be integrated as a photonic integrated circuit.

In one exemplary embodiment, a wavelength selector may be optically connected to the output port 214-1 (not illustrated in FIG. 2). Under the embodiment, the multiwavelength laser light source 200 can be configured as a laser light source with a wavelength selective function. In one implementation, the wavelength selector is configured to exhibit a center wavelength of the passband of the wavelength selector that is equal to a center wavelength of a passband of the second optical filter determining a peak wavelength of the multiwavelength laser output to be selected. A 3-dB bandwidth of the passband of the wavelength selector is also configured to be not larger than the wavelength spacing of the passbands of the second optical filter. Thus, the wavelength selector is configured to select and output at least one of the pluralities of major peak wavelengths. Under certain embodiments, the center wavelength of the passband of the wavelength selector is configured tunable, desirably by an external electric signal. Under certain embodiments, the wavelength selector exhibits a passband, where a center wavelength of the passband preferably satisfies wavelength requirement of the ITU-T WDM grid.

Figure 3:
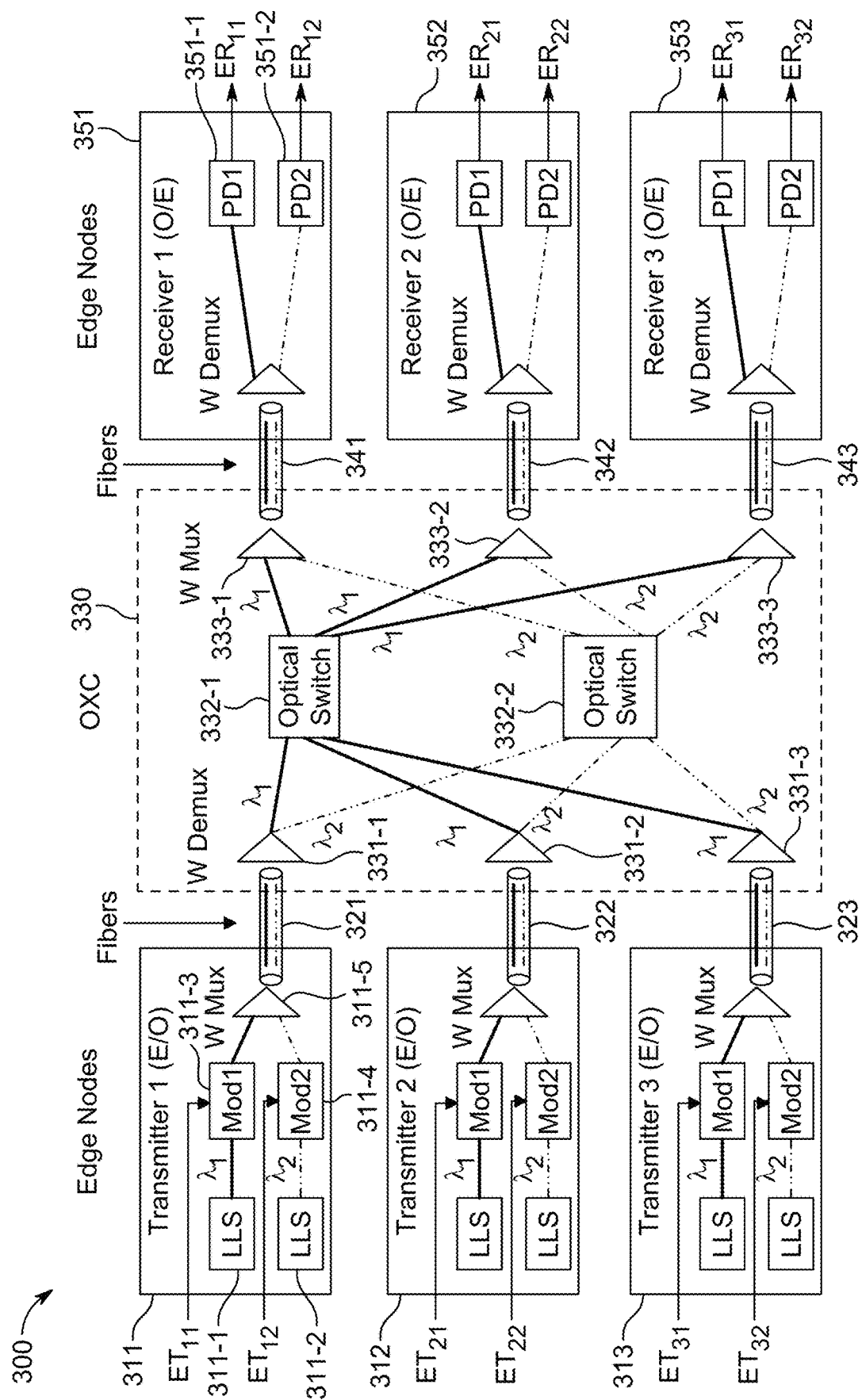
FIG. 3 is a block diagram illustrating an exemplary WDM network system with the OXC hosting signal transmissions from three edge nodes at source points to three edge nodes at destination points, with two wavelengths assigned per each of the fibers, according to certain embodiments.

FIG. 3 is a block diagram illustrating an exemplary WDM network system 300 with the OXC 330 hosting signal transmissions from three edge nodes 311-313 at source points to three edge nodes 351-353 at destination points, with two wavelengths $\lambda_1$ and $\lambda_2$ assigned per each of the fibers 321-323, 341-343 according to certain embodiments.

The OXC 330 in the present configuration is referred to as 3×3 OXC with two wavelengths per fiber.

Here, each of the three edge nodes 311-313 at the source points includes, but not limited to, a transmitter (E/O) 311-313. Each of the transmitters, the transmitter 1, 311, for example, further includes, but not limited to, i) two laser light sources (LLS1, LLS 2) 311-1, 311-2, each configured to output a laser output at wavelengths $\lambda_1$ and $\lambda_2$, respectively, ii) two optical modulators (Mod1 and Mod2) 311-3, 311-4, configured to modulate each of the laser outputs with electric transmitter signals ($ET_{11}$ and $ET_{12}$), respectively, and iii) a wavelength multiplexer (W Mux) 311-5, configured to multiplex two laser outputs modulated and to output a wavelength multiplexed light signal to be input to the input port 1 of the fiber 321 assigned for the transmitter 1, 311.

The OXC 330 includes, but not limited to, i) three wavelength demultiplexers (W Demux) 331-1, 331-2, 331-3, each configured to receive inputs from the three fibers 321-323 each connected with the three transmitters, 311-313, respectively, ii) two optical switches (OS) 332-1, 332-2 for the two wavelengths $\lambda_1$ and $\lambda_2$, and iii) three wavelength multiplexers (W Mux) 333-1, 333-2, 333-3, each of the W Mux outputs to the three fibers 341-343, each connected with three receivers 351-353 at the destination points, respectively.

Each of the three receivers, for example, Receiver 1, 351, includes, but not limited to, i) a wavelength demultiplexer (W Demux), 351-3, and ii) two photodetectors (PD1, PD2) 351-1, 351-2, for each of demultiplexed light signals at the two wavelengths $\lambda_1$ and $\lambda_2$. The PD1 and PD2 each is configured to detect the demultiplexed light signals and output electric receiver signals $ER_{11}$ and $ER_{12}$, respectively.

Here, the OXC 330 is configured to establish a light path for each of the transmitters at the source points to each of the receivers at the destination points, by switching connections and selecting a wavelength and a route, based on availabilities of connections and wavelengths, and according to directions from a system administrator not illustrated here.

Thus, each of the transmitters 311-313 is required to install two laser light sources for the two wavelengths, in this example. In general, for ensuring availability of a full transmission capacity, a transmitter is required to install a same number of laser light sources as a number of wavelengths that a WDM network system adopts, as discussed earlier in FIG. 1. A multiple wavelength laser light source, according to the present disclosure and configured to be wavelength selectable would be one of the most promising candidates for such applications. Additionally, when a required traffic at a specific source point is not so high that a transmission capacity of a single wavelength was sufficient, installing just a wavelength selectable laser light source which can vary an output wavelength based on a wavelength assignment from the system administrator, according to the present disclosure would provide a solution to satisfy both a cost efficiency and a system requirement that the light source needs to be ready to any wavelength assignment for reconfiguring the wavelength routing.

Figure 4:
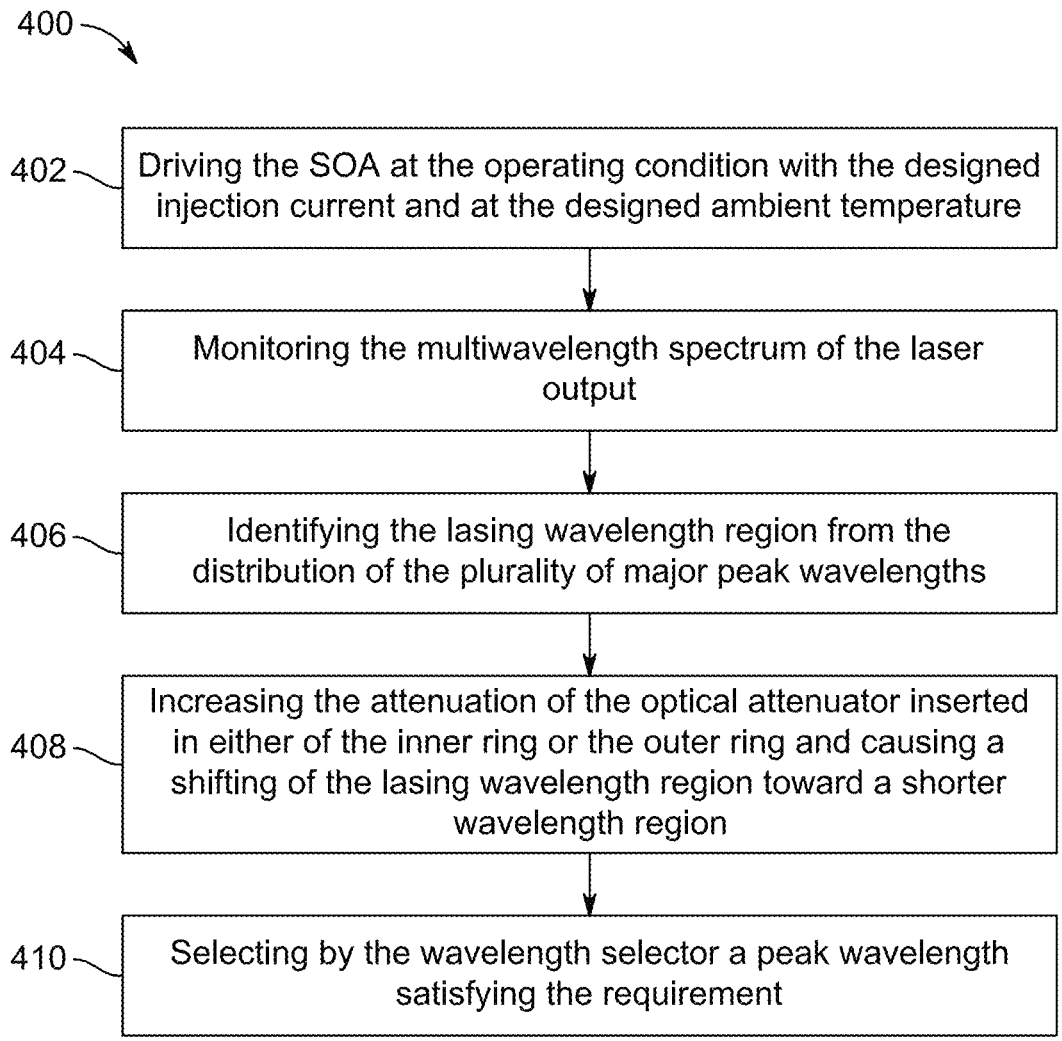
FIG. 4 is an exemplary flowchart of a method of controlling the laser light source as a wavelength selective or wavelength tunable light source for an application to a WDM network system, according to certain embodiments.

FIG. 4 is an exemplary flowchart of a method 400 of controlling the laser light source 200 as a wavelength selective or wavelength tunable light source for an application to an WDM network system. The method 400 is implemented on the multiwavelength laser light source 200 configured to generate a laser output with multiple peak wavelengths or with a single peak wavelength. In some implementations, the multiwavelength laser light source 200 includes the variable optical attenuator inserted in series in either one of the outer ring or the inner ring, or even in both, where the lasing wavelength region of the multiwavelength laser is configured tunable or variable by varying the attenuation(s) of either or both of the attenuators. The multiwavelength laser light source further includes a wavelength selector added at the output port and is configured to select and output at least a peak wavelength from the multiple wavelength peaks, based on a requirement from the system administrator.

At block 402, the semiconductor optical amplifier (SOA 202) is driven at a designed operating condition with a designed injection current and at a designed ambient temperature for amplification of the optical signal, in accordance with one implementation.

At step 404, the multiwavelength spectrum of the laser output is monitored, in accordance with the implementation.

At step 406, the lasing wavelength region is identified from the distribution of the plurality of major peak wavelengths in accordance with one implementation.

At step 408, the attenuation of the optical attenuator inserted in either of the inner ring 200-I or the outer ring 200-O is varied, and as a result, a shifting of the lasing wavelength region is caused, when required in selecting at least one from the plurality of major peak wavelengths to satisfy the requirement, in accordance with one implementation.

A step 410, the wavelength selector selects at least a peak wavelength satisfying the requirement, in accordance with one implementation.

EXAMPLES

An experimental set up for measuring characteristics of the multiwavelength fiber laser disclosed in FIG. 2 was constructed focusing on applications in far L and U bands. The inner ring 200-I included an L band BOA 202 which is polarization sensitive, two optical circulators (CIR1 204 and CIR2 206), and a tunable optical (TF) as the first optical filter 208. The outer ring 200-O included the L-band BOA 202, the MZI as the second optical filter 212, the polarization controller (PC) 210, a variable optical attenuator (VOA) 216, two optical circulators (CIR1 and CIR2), and a 70:30 fused fiber coupler as the output port (C3) 214. The outer and inner rings measured around 5.5 and 3.2 meters, respectively. Single mode fibers without the polarization maintaining characteristics were used for both of the first and the second optical waveguides 209 and 218.

The gain media of the working example was provided by a butterfly packaged BOA 202 designed for operating in the L band. A traveling-wave InP/InGaAsP Multiple Quantum Well (MQW) amplifier (BOA 202-1080S) was manufactured by Thorlabs Corporation, USA, and was capable of equally amplifying; single as well as multiwavelength channels. The device typically exhibited a gain ripple of around −0.06 dB. The facet reflectivity of the BOA 202 was controlled not larger than 0.1%. The BOA was driven by a laser diode driver operating at 20° C. with a thermistor resistance of 10 k.

The MZI 212 was constructed by using two 3 dB couplers and an optical delay line (ODL 212-2). The polarization controller 210 with a half-wave plate and two quarter-wave plates was placed in the laser cavity. The polarization state was adjusted in order to achieve a stable laser output. The optical circulators were polarization-insensitive, with isolation of more than 40 dB and an insertion loss of about 1.2 dB from one port to the next. Finally, the 30% portion of the 70:30 fused fiber coupler provided the laser output, allowing 70% of ASE to be engaged for feedback to the main cavity.

The laser output was observed by an optical power meter (Newport) and an optical spectrum analyzer (Anritsu 8070) to characterize the multiwavelength laser. Measured results are described in detail with FIGS. 5-10 below.

Figure 5:
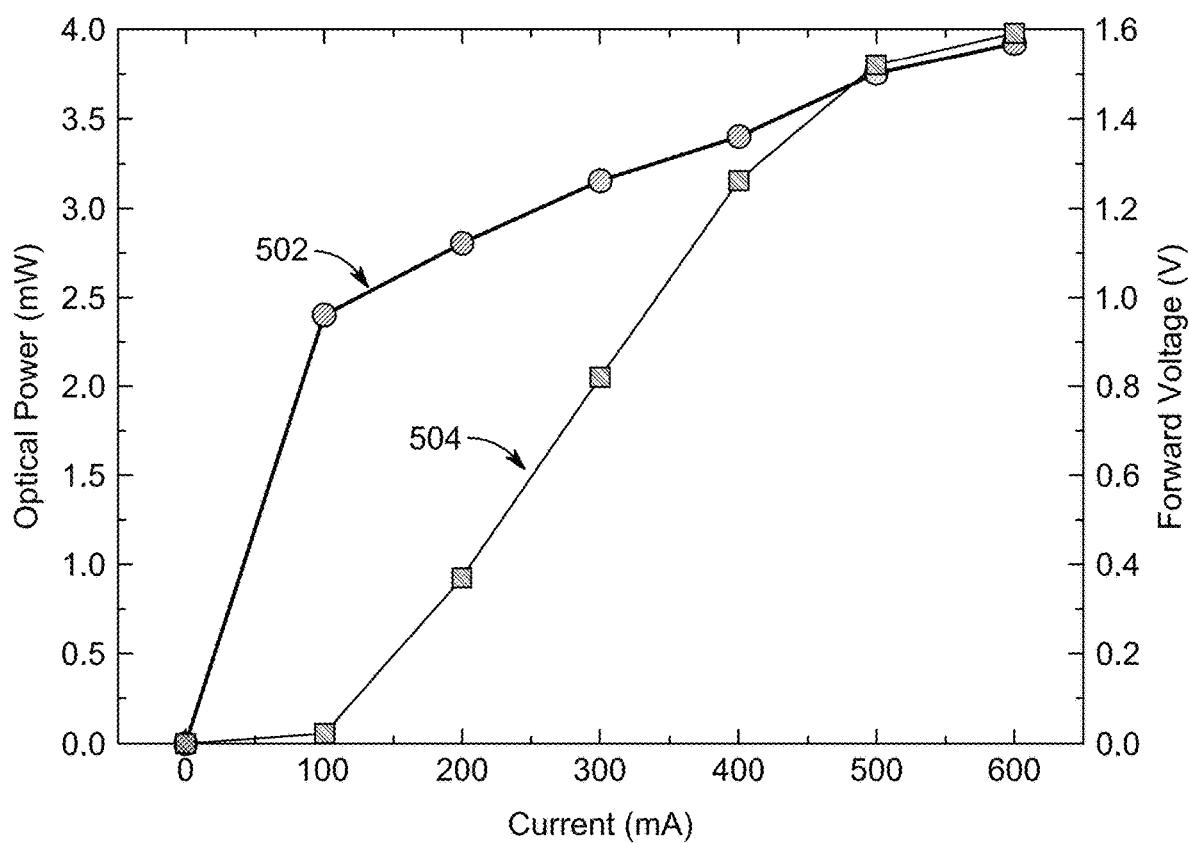
FIG. 5 is an exemplary graph illustrating measured injection current (I) dependences of optical output power (L) and forward voltage (V) for the fiber laser with BOA, for the experimental set up, according to certain embodiments.

FIG. 5 is a graph illustrating measured injection current (I) dependences of optical output power 504 and forward voltage (V) 502 for the fiber laser with BOA, for the experimental set up described above. The lasing threshold current ($I_{th}$) was measured to be about 100 mA for a forward voltage of about 1 V, with a generated optical output power of about 0.05 mW. The amplifier was capable of producing an output optical power of almost 4 mW for a forward voltage of about 1.6 V while being driven at about 600 mA.

Figure 6:
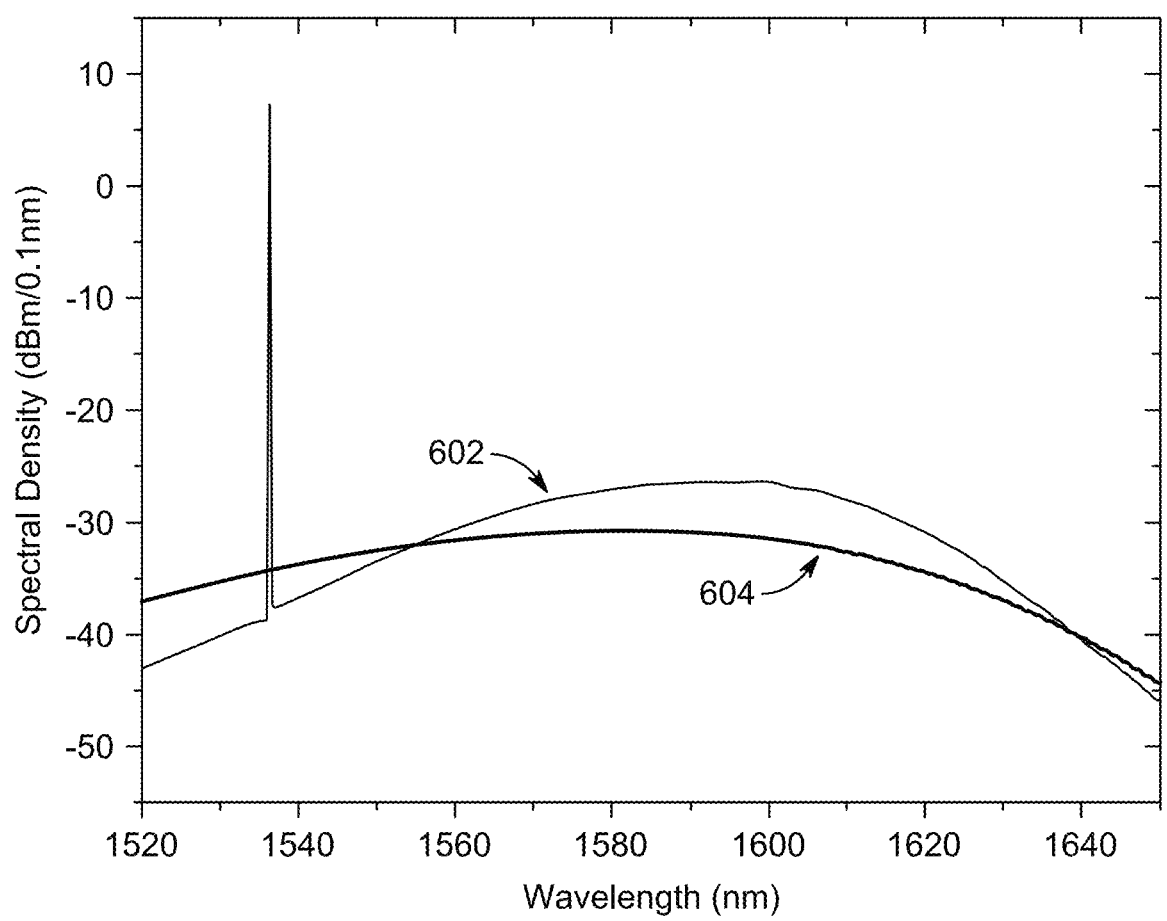
FIG. 6 is a graph illustrating measured ASE spectrum of the BOA, the trace 604 without the feedback control light, and the trace 602, the modified ASE spectrum with the feedback control light at about 1535 nm for the experimental sett up, according to a certain embodiments.

FIG. 6 is a graph illustrating measured ASE spectrum of the BOA 202, the trace 604 without the feedback control light, and the trace 602, the modified ASE spectrum with the feedback control light at about 1535 nm. Here, the driving current of the BOA 202 was 400 mA, the tunable optical filter 208 was tuned at about 1535 nm, namely, in a proximity of a shorter wavelength end of the ASE gain band of the SOA under the operating condition and without the feedback control light.

The graph confirmed the feedback control light at about 1535 nm helped improve the ASE gain profile in the gain-clamped SOA, and did not interfere with the lasing in far L and U bands. The typical 3-dB bandwidth of the BOA 202 without the feedback control light was about 90 nm, which decreased to about 60 nm in the gain clamped SOA with the introduction of the feedback control light. Thus a gain compression was confirmed. The peak wavelength of the ASE for the BOA 202 without the feedback control light was found to be about 1581.0 nm with a peak power of −30.6 dBm, which shifted to about 1596.6 nm with a peak power of −26.13 dBm due to feedback control light in the inner ring 200-I. The modified ASE of the gain clamped SOA exhibited a red shift of about 15 nm in the peak gain wavelength with an improvement of about 4.47 dB in peak power.

Figure 7A:
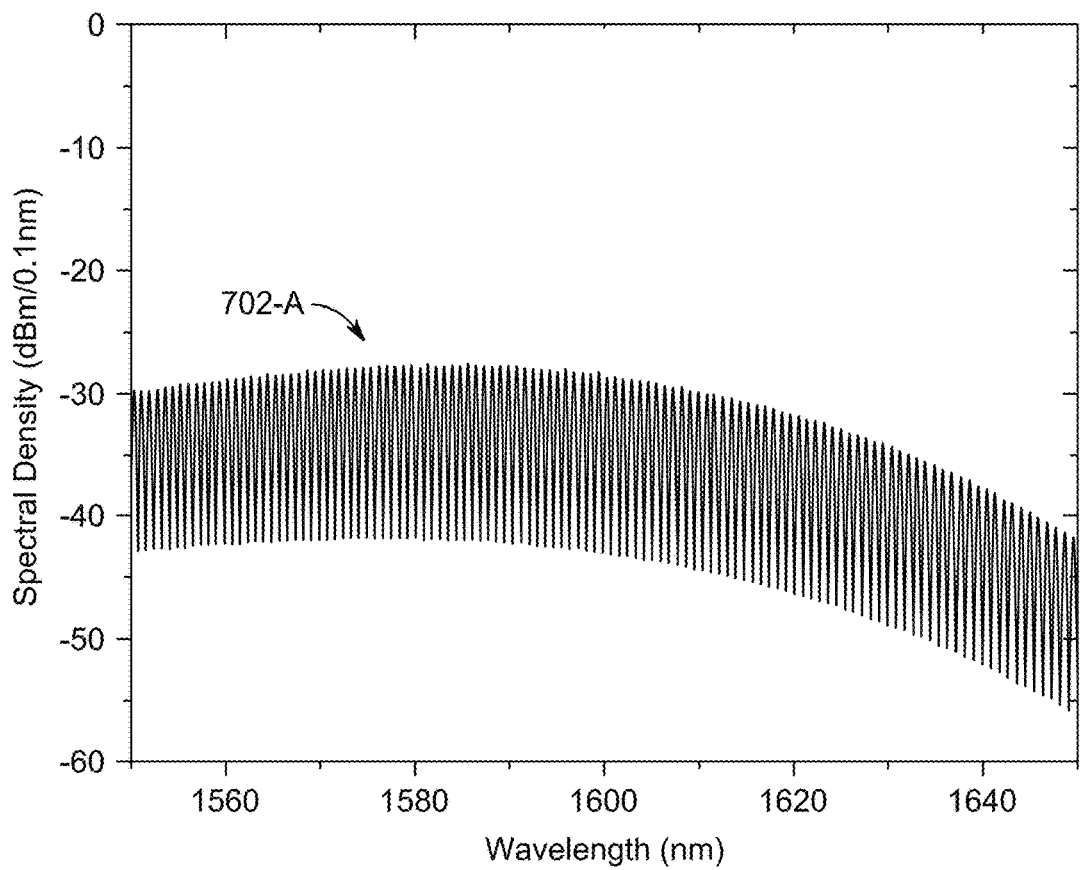
FIG. 7A is a graph illustrating a measured transmission spectrum of a Mach-Zehnder Interferometer (MZI) comb filter, according to certain embodiments.
Figure 7B:
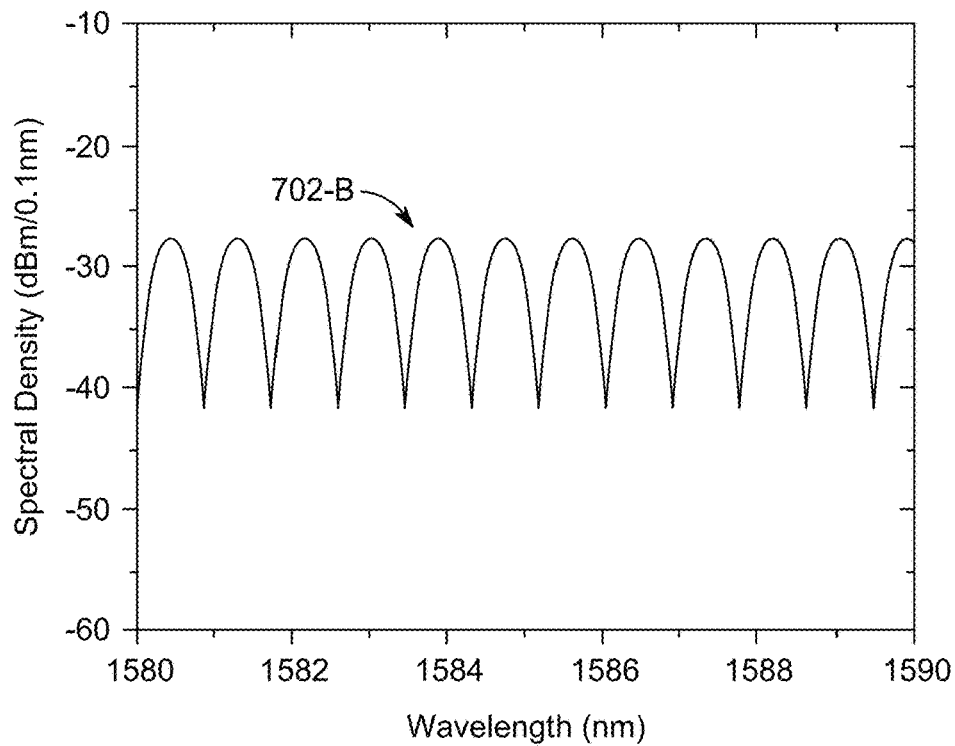
FIG. 7B is a graph illustrating a portion of the measured transmission spectrum of the MZI comb filter illustrated in FIG. 7A, according to certain embodiments.

FIGS. 7A and 7B are graphs illustrating measured transmission spectrum of the MZI 212 comb filter. The wavelength spacing between two adjacent peaks of passbands, also known as the free spectral range (FSR), was about 0.8 nm with an extinction ratio of about 13 dB for each of its passbands. The 3 dB bandwidth of each of its transmission peaks was not greater than 0.1 nm, which was a resolution limit of the optical spectrum analyzer. The interferometer exhibited a total loss of about 3.1 dB, while its operation wavelength range was from 1520 to 1650 nm. The FSR of the comb and center wavelengths of the passbands were tuned by changing the length in one of the arms of MZI 212 with the help of ODL 212-2.

Figure 8A:
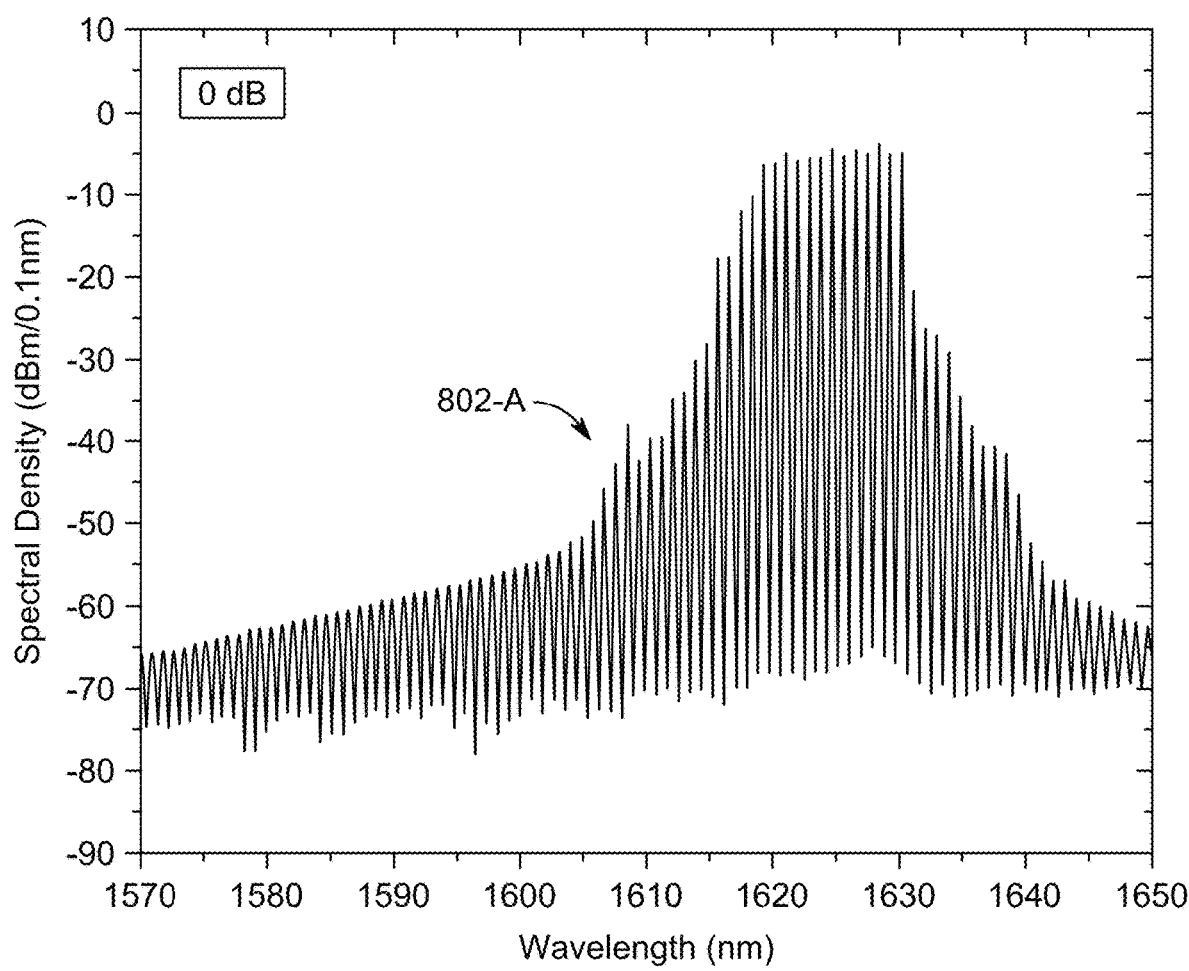
FIG. 8A is a graph illustrating a measured spectrum of the multiwavelength laser output when without inserting the VOA, according to certain embodiments.
Figure 8B:
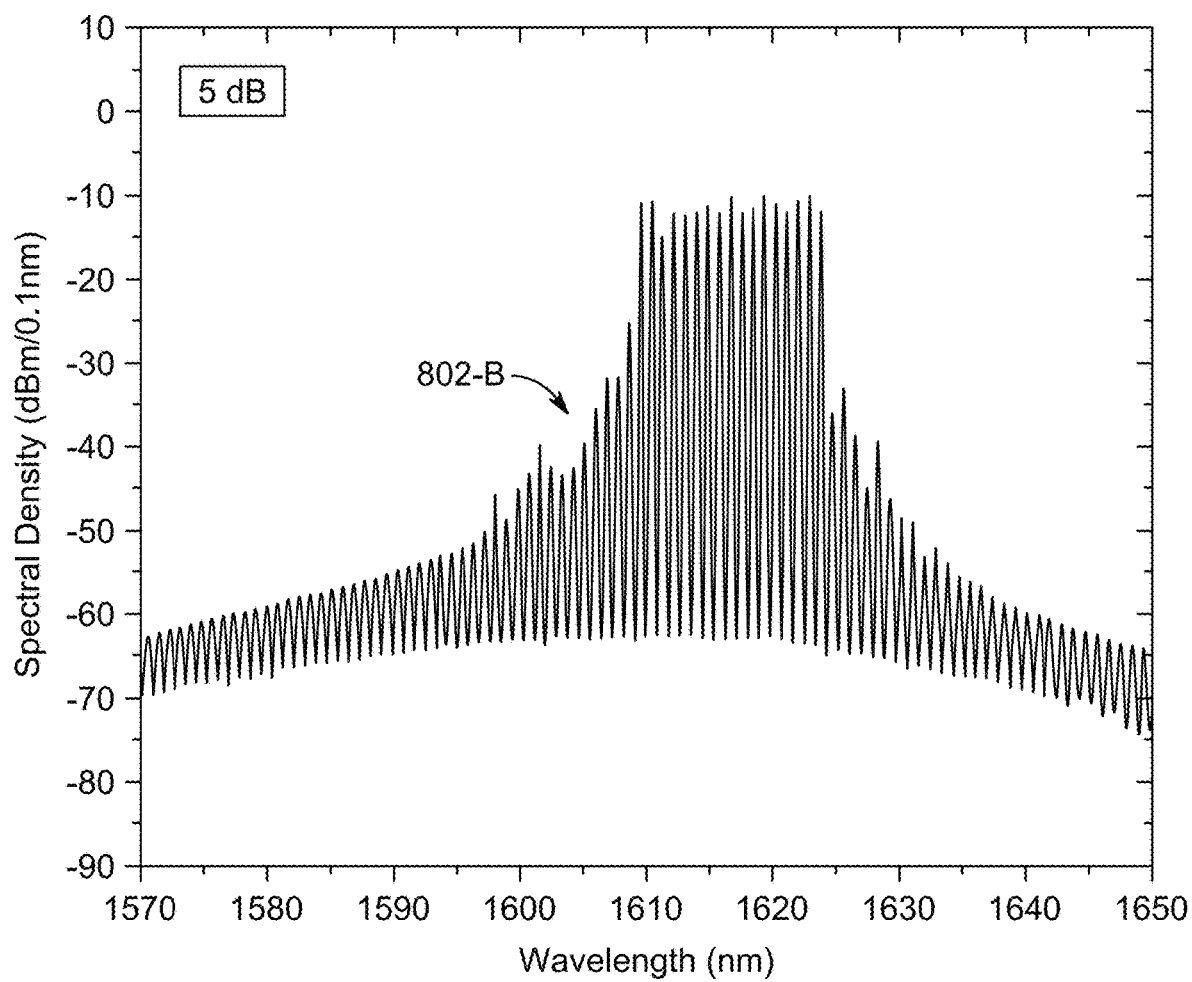
FIG. 8B is a graph illustrating a measured spectrum of the multiwavelength laser output with 5 dB attenuation through VOA, according to certain embodiments.
Figure 8C:
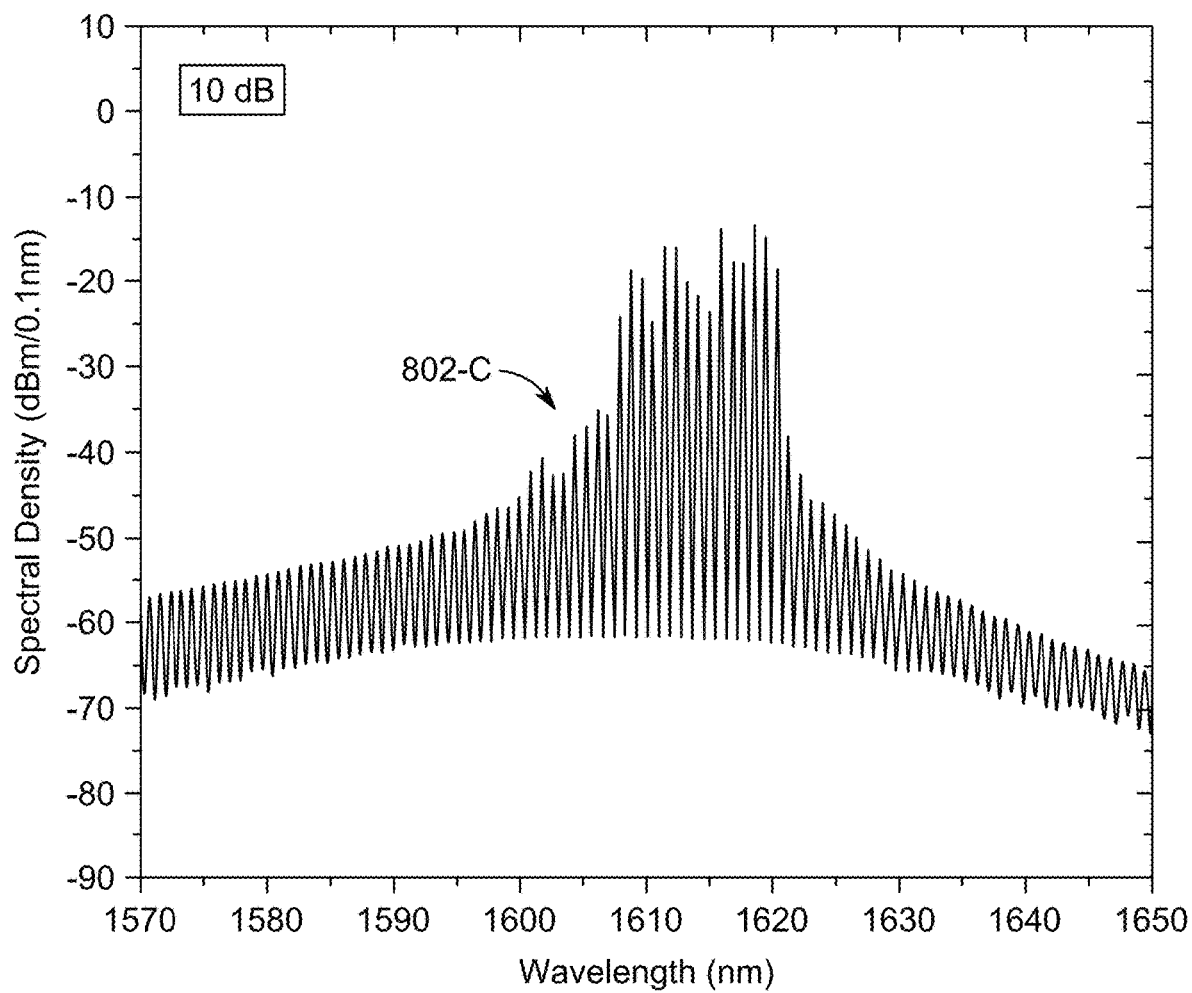
FIG. 8C is a graph illustrating a measured spectrum of the multiwavelength laser output with 10 dB attenuation through VOA, according to certain embodiments.

FIGS. 8A, 8B and 8C are graphs illustrating measured spectra of multiwavelength laser output with different values of attenuation of the VOA 216 in the outer ring 200-O, each with attenuations of 0 dB, 5 dB and 10 dB, respectively.

FIG. 8A is a graph illustrating the measured output spectra 802-A with the attenuation at 0 dB. Over 30 lasing peaks were generated in the far L and U bands with an average peak power of about −10 dBm, when counted the lasing peaks with side mode suppression ratio (SMSR) of at least 30 dB, under the measurement by the optical spectrum analyzer (OSA) with a resolution of 0.1 nm. Most of the main lasing peaks exhibited a SMSR of around 60 dB. The total output power of the multiwavelength laser was about 8.9 dBm measured with the optical power meter.

FIG. 8B is a graph illustrating the measured output spectra 802-B with the attenuation through VOA 216 at 5 dB. The number of lasing peaks reduced to around 20. Further in FIG. 8C with the measured output spectra 802-C, the number of lasing peaks reduced to 15, when the attenuation was further increased to 10 dB. In the last case of 802-C with the attenuation 10 dB, the lasing peaks exhibited large power fluctuations ranging about 10 dB. This is due to intense gain competition.

Those experimental results in FIG. 8 revealed a blue shift of a lasing wavelength region when the attenuation in the outer ring 200-O was increased. A shift rate of the lasing wavelength region of about minus 1.2±0.2 nm/dB for 5 to 10 dB increase of the attenuation was confirmed, where the lasing wavelength region was defined by a width of the lasing spectrum at 3 dB to 10 dB down power level from the lasing peaks, where the minus indicates a blue shift. A wavelength shift of 12 nm due to the 10 dB attenuation, for example, corresponds to a shift of about 15 wavelength channels according to the ITU-T WDM grids currently prevailing with the wavelength spacing of about 0.8 nm.

Those results demonstrate a potential capability and a practical impact of the multiwavelength laser of the present disclosure in the application to a wavelength tunable/selectable laser light source.

It is noted that in FIG. 6, the gain clamped SOA exhibited the increase and the red shift of the gain peak toward the far L Band, in addition to the narrowing of the ASE gain bandwidth, namely the gain compression. This change is attributed to a carrier density change, due to introduction of the feedback control light. The multiwavelength operation in far L and U bands was achieved by exploiting the gain compression phenomena of the BOA 202.

Based on above interpretation, it is also noted that the gain clamped SOA exhibited a gain increase when an attenuation was added in series to the circuit, namely to the inner ring 200-I in the present disclosure, as discussed earlier in FIG. 2. This gain change can be attributed to an increase of the carrier density to generate an increased gain required to balance with an additional loss due to the attenuation added. Those also support an applicability of the multiwavelength laser of the present disclosure with an attenuator inserted in the inner ring 200-I with an enhanced wavelength tunable characteristics as the wavelength tunable laser light source.

Figure 9:
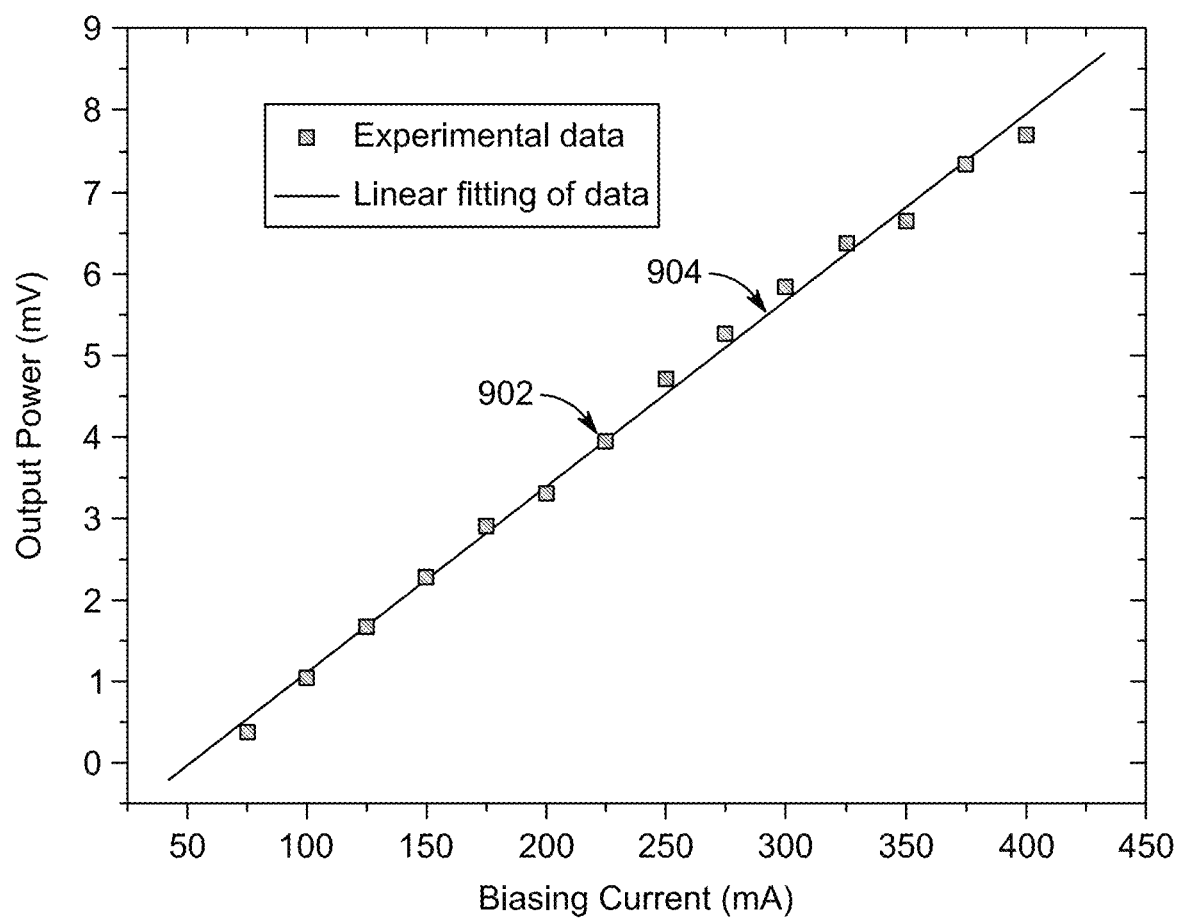
FIG. 9 is a graph illustrating biasing current dependence of output power from the multiwavelength laser of the experimental set up, according to certain embodiments.

FIG. 9 is a graph illustrating biasing current dependence of output power from the multiwavelength laser of the experimental set up, with experimental data by filled squares 902, and a linear fitting by line 904. When the biasing current of the BOA 202 was 400 mA, the electro-optic efficiency of the multiwavelength fiber laser was about 2%, with output power of 7.8 mW. The low efficiency is due to the insertion loss introduced by the MZI 212 and the presence of passive components used in the cavity. The stability of the proposed multiwavelength laser source was evaluated by repeated measurement of the peak output power and wavelength spectrum over one hour.

Figure 10:
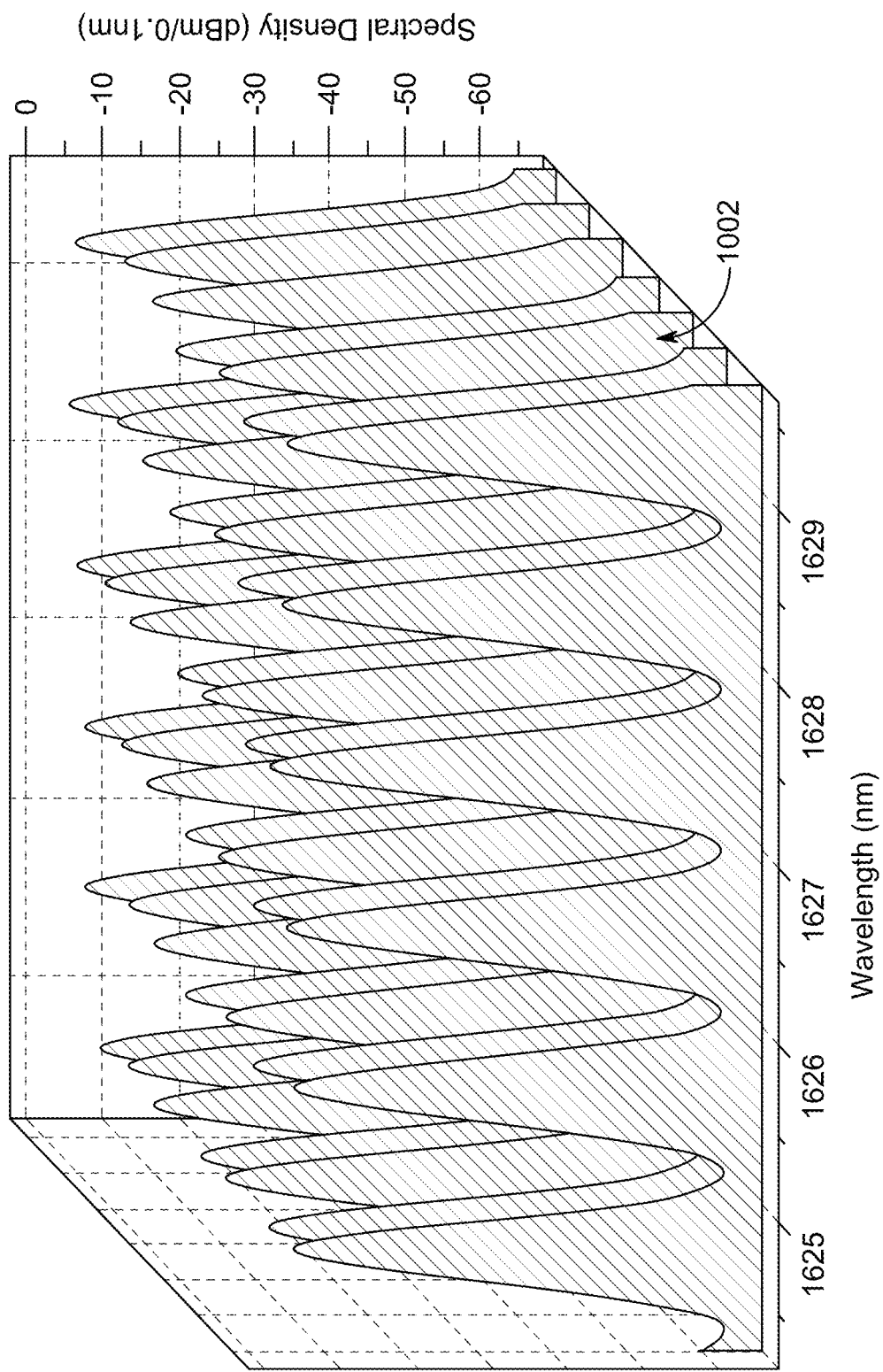
FIG. 10 is a graph illustrating measured spectrum for eight lasing channels of the laser output from the multiwavelength fiber laser, for measurements repeated every 10 minutes for eight lasing channels, according to certain embodiments.

FIG. 10 is a graph illustrating measured spectrum for eight lasing channels of the laser output from the multiwavelength fiber laser, for measurements repeated every ten minutes for an hour for eight lasing channels, at room temperature, according to certain embodiments. Fluctuations in the maximum peak power and the peak wavelengths, respectively were found to be within about 1 dB and within about 0.08 nm, respectively, demonstrating that the laser source is stable at room temperature.

The stability of the multiwavelength system, in essence, can be attributed to the deployment of the feedback control light, namely, the stabilizer beam in the inner ring 200-I, thereby allowing the multiple lasing wavelengths not to compete for gain. The stability of the laser light source 200 can be further enhanced by using standard packaging techniques.

Table I summarizes different reports on semiconductor multiwavelength lasers with their approaches and performance aspects. Multiwavelength laser employing an intrinsic filter (Reference 4) shows similar performance in terms of the number of channels; however, it operates in the L band only. On the other hand, the laser light source 200 as described in the present disclosure, for example, with reference to FIG. 2 operates equally well in both far L and U bands simultaneously as appears in the last row. The references 1) to 4) listed with the Table I are incorporated herein by reference.

TABLE I

| Operating band | Type of cavity | Type of filter | Number of lasing lines | References * |
| --- | --- | --- | --- | --- |
| C + L | Linear | Sagnac loop mirror | 18 | 1) D. S. Moon et al. |
| C | Linear | Diffraction grating | 6 | 2) M. Aljada et al. |
| L | Ring | Fiber loop mirror | 11 | 3) G. Sun et al. |
| L | Ring | Two-mode fiber interferometer | 30 | 4) H. Ahmad et al. |
| Far L + U | Dual ring | Mach-Zehnder interferometer | 30 | This |

1) D.S. Moon et al., "Tunable multi-wavelength SOA fiber laser based on a Sagnac loop mirror using an elliptical core side-hole fiber," *Opt. Exp.*, vol. 15, o. 13, pp. 8371-8376, 2007.
2) M. Aljada et al., "A tunable multiwavelength laser employing a semiconductor optical amplifier and opto-VLSI processor," *IEEE Photon. Technol. Lett.*, vol. 20, no. 10, pp. 815-817, May 15, 2008.
3) G. Sun et al., "Polarization controlled tunable multiwavelength SOA-fiber laser based on few-mode polarization maintaining fiber loop mirror," *Opt. Fiber Technol.*, vol. 17, no. 1, pp. 79-83, Jan. 2011.
4) H. Ahmad et al., "Stable multiwavelength semiconductor optical amplifier-based fiber laser using a 2-mode interferometer," *Micro. Opt. Technol. Lett.*, vol. 62, no. 1, pp.3363-3368, 2020.

Obviously, numerous modifications and variations of the present disclosure are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, define, in part, the scope of the foregoing claim terminology such that no inventive subject matter is dedicated to the public.

The invention claimed is:

1. A laser light source comprising:
   an inner ring comprising:
      a semiconductor optical amplifier (SOA);
      a pair of optical circulators;
      a first optical filter; and
      a first optical waveguide optically connecting other elements of the inner ring in series, with the SOA aligned between the pair of optical circulators, to form the inner ring; and
   an outer ring comprising:
      the SOA;
      the pair of optical circulators;
      a second optical filter;
      an output port; and
      a second optical waveguide optically connecting elements of the outer ring in series to form the outer ring, except for a portion of the inner ring between the pair of optical circulators, the portion shared with the outer ring,
   wherein the pair of optical circulators are configured to limit the direction of light propagation in the SOA
      a) to a first direction for a light circulating the inner ring, and
      b) to a second direction opposite to the first direction, for a light circulating the outer ring,
   and wherein the inner ring is configured to operate as a gain-clamped SOA with a feedback control light under an operating condition with a designed injection current and at a designed ambient temperature, wherein a peak wavelength of the feedback control light is configured to be defined by a passband of the first optical filter, and wherein further,
      the outer ring is configured to generate from the output port a laser output in a wavelength region corresponding to a gain region of the gain-clamped SOA, wherein the laser output is comprising a peak wavelength defined by a passband of the second optical filter, and wherein the second optical filter comprises a comb filter configured to exhibit passbands with
         i) designed center wavelengths of the passbands,
         ii) a designed free spectral range, and
         iii) a 3 dB bandwidth of each of the passbands not larger than 0.03 nm,
      and an operation wavelength range of the comb filter covering a gain region of the gain clamped SOA under the operating condition.

2. The laser light source of claim 1, wherein the first optical filter is further configured to locate the peak wavelength of the feedback control light in a proximity of a shorter wavelength end of a 3-dB amplified spontaneous emission (ASE) gain band of the SOA under the operating condition and without the feedback control light.

3. The laser light source of claim 2, wherein the first optical filter is comprising a Fabry-Perrot interferometer with a passband configured to support a stable operation of the feedback control light.

4. The laser light source of claim 1, wherein center wavelength(s) of the passband of the second optical filter is configured wavelength tunable, and the center wavelength(s) of the passband(s) and a spacing of the passbands when available are further configured to satisfy requirements of the ITU-T WDM grids.

5. The laser light source of claim 1, wherein the outer ring is further comprising a polarization controller inserted in series and configured to stabilize the laser output.

6. The laser light source of claim 1, further comprising an optical attenuator inserted in either of the inner ring or the outer ring in series.

7. The laser light source of claim 6, further comprising a wavelength selector optically connected with the output port, wherein
   the optical attenuator is comprising a variable optical attenuator, wherein a lasing wavelength region defined by a distribution of the peak wavelength of the laser output is configured wavelength tunable by varying an attenuation of the variable optical attenuator, and
   the wavelength selector is configured to select and output at least a peak wavelength of the laser output.

8. The laser light source of claim 1, further comprising a wavelength selector optically connected with the output port, wherein the wavelength selector is configured to select and output at least a peak wavelength of the laser output.

9. The laser light source of claim 1, wherein the SOA is configured to exhibit a facet reflectivity not larger than 0.1%, and the 3-dB amplified spontaneous emission (ASE) gain band distributed in C-band to L-band, under the operating condition without the feedback control light,
the first optical filter is comprising a fiber Fabry-Perrot interferometer with a passband configured to support a stable operation of the feedback control light, and configured to exhibit a 3-dB bandwidth not larger than about 0.03 nm and with a free-spectral range not smaller than about 100 nm,
the first optical waveguide and the second optical waveguide are comprising a single mode fiber,
the second optical filter is comprising a Mach-Zehnder Interferometer (MZI) with designed center wavelengths of the passbands, and with a designed free spectral range not larger than about 0.8 nm and with a 3 dB bandwidth of each of the passbands not larger than about 0.03 nm, with an operating wavelength range covering a gain region of the gain clamped SOA,
the optical circulators are configured to be polarization insensitive and to provide isolation not smaller than about 40 dB,
the polarization controller is further comprising two quarter-wave plates and a half-wave plate,
the output port is comprising a fused fiber coupler, and
the outer ring is configured to generate the laser output distributed in a range from L-band to U-band, with the plurality of peak wavelengths.

10. The laser light source of claim 1, wherein the first optical waveguide and the second optical waveguide comprise an optical waveguide formed on a substrate, wherein further the laser light source is configured as a photonic integrated circuit.

11. An optical wavelength division multiplex (WDM) network system comprising:
a transmitter comprising:
a laser light source; and
a wavelength multiplexer;
a fiber transmission line;
a optical cross connect comprising an optical switch; and
a receiver comprising:
a wavelength demultiplexer;
and a photodetector,
wherein the laser light source further comprises:
an inner ring comprising:
a semiconductor optical amplifier (SOA);
a pair of optical circulators;
a first optical filter; and
a first optical waveguide optically connecting other elements of the inner ring in series, with the SOA aligned between the pair of optical circulators, to form the inner ring; and
an outer ring comprising:
the SOA;
the pair of optical circulators;
a second optical filter;
an output port; and
a second optical waveguide optically connecting elements of the outer ring in series to form the outer ring, except for a portion of the inner ring between the pair of optical circulators, the portion shared with the outer ring,
wherein,
the pair of optical circulators are configured to limit a direction of light propagation in the SOA
a) to a first direction for a light circulating the inner ring, and
b) to a second direction opposite to the first direction for a light circulating the outer ring,
and wherein,
the inner ring is configured to operate as a gain-clamped SOA with a feedback control light under an operating condition with a designed injection current and at a designed ambient temperature, wherein a peak wavelength of the feedback control light is configured to be defined by a passband of the first optical filter,
and wherein further,
the outer ring is configured to generate from the output port a laser output within a wavelength region corresponding to a gain region of the gain-clamped SOA under the operating condition, wherein the laser output is comprising a peak wavelength of the laser output defined by a passband of the second optical filter,
wherein the first optical filter is configured to locate the peak wavelength of the feedback control light in a proximity of a shorter wavelength end of a 3-dB amplified spontaneous emission (ASE) gain band of the SOA under the operating condition and without the feedback control light, and
wherein the second optical filter is comprising a comb filter configured to exhibit passbands with a designed free spectral range and with a 3 dB bandwidth of each of the passbands not larger than 0.03 nm, and an operation wavelength range covering a gain region of the gain-clamped SOA under the operating condition.

12. The WDM network system of claim 11, wherein center wavelength(s) of the passband of the second optical filter is configured tunable,
wherein the second optical filter is further configured to generate the laser output with at least a peak wavelength, each satisfying wavelength requirements of the ITU-T WDM grids.

13. The WDM network system of claim 11, wherein the outer ring of the laser light source further comprises a polarization controller inserted in series and configured to stabilize the laser output.

14. The WDM network system of claim 11, wherein the outer ring of the laser light source is further comprising a wavelength selector optically connected with the output port, wherein the wavelength selector is configured to select and output at least a peak wavelength of the laser output.

15. The WDM network system of claim 11, wherein the laser light source is further comprising a variable optical attenuator inserted in either of the inner ring or the outer ring in series.

16. The WDM network system of claim 11, wherein the laser light source is further comprises:
a variable optical attenuator inserted in either of the inner ring or the outer ring in series, and
a wavelength selector optically connected with the output port,
wherein a lasing wavelength region defined by a distribution of the peak wavelength of the laser output is configured to be wavelength tunable by varying an attenuation of the optical attenuator,
and wherein the wavelength selector is configured to select and output at least a peak wavelength from the laser output, wherein the wavelength selector is further configured to exhibit center wavelength(s) of passbands of the wavelength selector satisfying requirements of the ITU-T WDM grids.

17. A method of controlling the laser light source of the claim 16 in a wavelength division multiplex (WDM) network system, the method comprising:
driving the SOA at the operating condition with the designed injection current and at the designed ambient temperature;
monitoring a wavelength spectrum of the laser output;
identifying a peak wavelength to be selected from the laser output, based on a requirement from the application;
adjusting an attenuation of the variable optical attenuator and causing a shift of a lasing wavelength region defined by major peak wavelengths; and
selecting and outputting by the wavelength selector the peak wavelength satisfying the requirement.

18. The optical transmission network system of claim 11, wherein
the SOA is configured to exhibit a facet reflectivity not larger than 0.1%, and the 3-dB amplified spontaneous emission (ASE) gain band distributed in C-band to L-band, under the operating condition without the feedback control light,
the first optical filter is comprising a fiber Fabry-Perrot interferometer with a passband configured to support a stable operation of the feedback control light, and configured to exhibit a 3-dB bandwidth not larger than about 0.03 nm and with a free-spectral range not smaller than about 100 nm,
the first optical waveguide and the second optical waveguide comprise a single mode fiber,
the second optical filter comprises a Mach-Zehnder Interferometer (MZI) with designed center wavelength of the passbands, and with a designed free spectral range not larger than about 0.8 nm and with a 3 dB bandwidth of each of the passbands not larger than about 0.03 nm, with an operating wavelength range covering a gain region of the gain clamped SOA,
wherein the optical circulators are configured to be polarization insensitive and to provide isolation not smaller than about 40 dB,
the polarization controller further comprises two quarter-wave plates and a half-wave plate,
the output port comprises a fused fiber coupler, and
the outer ring is configured to generate the laser output distributed in a range from L-band to U-band, with the plurality of major peak wavelengths.

* * * * *